United States Patent
Wen et al.

(10) Patent No.: US 9,425,317 B1
(45) Date of Patent: Aug. 23, 2016

(54) FIN FIELD EFFECT TRANSISTOR (FINFET) DEVICE STRUCTURE WITH GE-DOPED INTER-LAYER DIELECTRIC (ILD) STRUCTURE

(71) Applicant: TAIWAN SEMICONDUCTOR MANUFACTURING CO., LTD., Hsin-Chu (TW)

(72) Inventors: Tsung-Yao Wen, Hsinchu (TW); Yao-De Chiou, Taoyuan (TW); Sheng-Chen Wang, Hsinchu (TW); Sai-Hooi Yeong, Zhubei (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/632,987

(22) Filed: Feb. 26, 2015

(51) Int. Cl.
*H01L 29/78* (2006.01)
*H01L 21/8234* (2006.01)
*H01L 29/66* (2006.01)

(52) U.S. Cl.
CPC ... *H01L 29/7851* (2013.01); *H01L 21/823487* (2013.01); *H01L 29/66545* (2013.01); *H01L 29/66795* (2013.01); *H01L 29/7856* (2013.01)

(58) Field of Classification Search
None
See application file for complete search history.

(56) References Cited

U.S. PATENT DOCUMENTS

| 2010/0311213 | A1* | 12/2010 | Orlowski | H01L 29/66795 438/164 |
| 2015/0206956 | A1* | 7/2015 | Kim | H01L 29/66795 438/294 |

* cited by examiner

Primary Examiner — Joseph Schoenholtz
(74) Attorney, Agent, or Firm — Birch, Stewart, Kolasch & Birch, LLP

(57) ABSTRACT

A fin field effect transistor (FinFET) device structure and method for forming the same are provided. The FinFET device structure includes a substrate and a fin structure extending above the substrate. The FinFET device structure includes an isolation structure, and the fin structure is embedded in the isolation structure. The FinFET device structure also includes a gate structure formed on a middle portion of the fin structure. The gate structure has a top portion and bottom portion, and the bottom portion is wider than the top portion. The FinFET device structure further includes a source/drain (S/D) structure formed adjacent to the gate structure.

19 Claims, 14 Drawing Sheets

FIN FIELD EFFECT TRANSISTOR (FINFET) DEVICE STRUCTURE WITH GE-DOPED INTER-LAYER DIELECTRIC (ILD) STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over the fin. Advantages of the FinFET may include reducing the short channel effect and allowing a higher current flow.

Although existing FinFET devices and methods of fabricating FinFET devices have been generally adequate for their intended purpose, they have not been entirely satisfactory in all aspects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1O' shows a cross-sectional representation along line AA' of FIG. 1O, in accordance with some embodiments of the disclosure.

FIG. 2F' shows a cross-sectional representation along line BB' of FIG. 2F, in accordance with some embodiments of the disclosure.

DETAILED DESCRIPTION

Figure 1A:
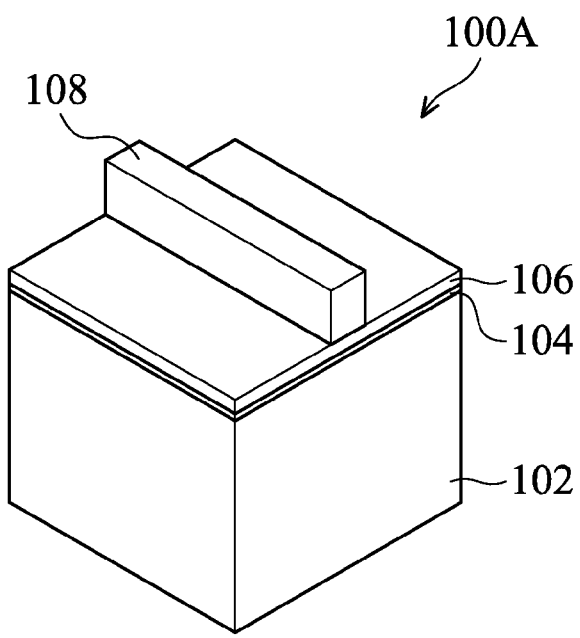
FIGS. 1A-1O show perspective representations of forming a fin field effect transistor (FinFET) device structure, in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

Embodiments for forming a fin field effect transistor (FinFET) device structure 100A are provided. FIGS. 1A-1O show perspective representations of forming a fin field effect transistor (FinFET) device structure 100A, in accordance with some embodiments of the disclosure.

The FinFET device structure 100A includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Afterwards, a dielectric layer 104 and a hard mask layer 106 are formed on the substrate 102, and a photoresist layer 108 is formed on the hard mask layer 106. The photoresist layer 108 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process The dielectric layer 104 is a buffer layer between the substrate 102 and the hard mask layer 106. In addition, the dielectric layer 104 is used as a stopping layer when the hard mask layer 106 is removed. The dielectric layer 104 may be made of silicon oxide. The hard mask 106 may be made of silicon oxide, silicon nitride, silicon oxynitride, or another applicable material. In some other embodiments, more than one hard mask layer 106 is formed on the dielectric layer 104.

The dielectric layer 104 and the hard mask layer 106 are formed by deposition processes, such as a chemical vapor deposition (CVD) process, high-density plasma chemical vapor deposition (HDPCVD) process, spin-on process, sputtering process, or other applicable processes.

Figure 1B:
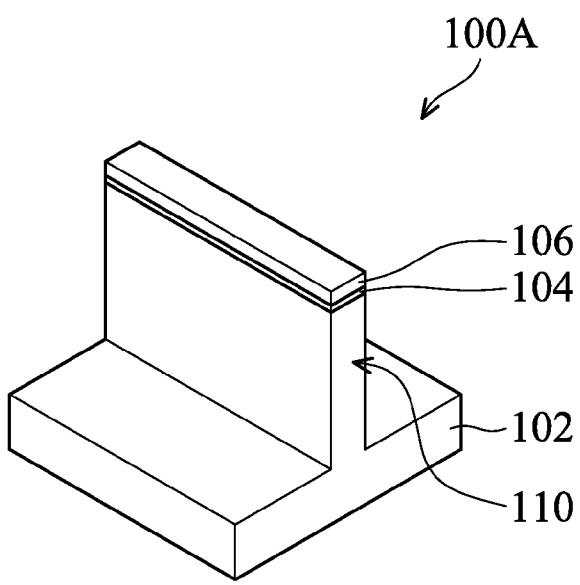

After the photoresist layer 108 is patterned, the dielectric layer 104 and the hard mask layer 106 are patterned by using the patterned photoresist layer 108 as a mask as shown in FIG. 1B, in accordance with some embodiments. As a result, a patterned dielectric layer 104 and a patterned hard mask layer 106 are obtained. Afterwards, the patterned photoresist layer 108 is removed.

Afterwards, an etching process is performed on the substrate 102 to form the fin structure 110 by using the patterned dielectric layer 104 and the patterned hard mask layer 106 as a mask. The etching process may be a dry etching process or a wet etching process. The etching process may be a time-controlled process, and continue until the fin structure 110 reaches a predetermined height.

It should be noted that the number of the fin structures 110 may be adjusted according to actual application, and it is not limited to one fin structure 110. In some embodiments, the fin structure 110 has a width that gradually increases from the top portion to the lower portion.

Figure 1C:
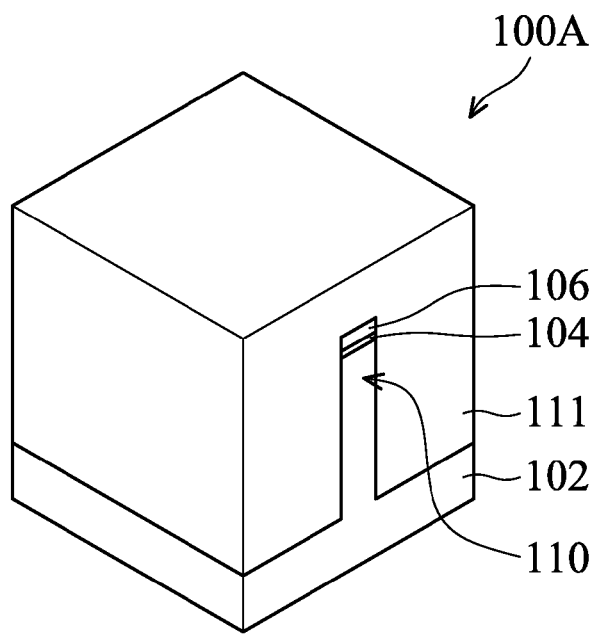

Afterwards, a dielectric material 111 is formed on the fin structure 110 as shown in FIG. 1C, in accordance with some embodiments. In some embodiments, the dielectric material 111 is made of silicon oxide, silicon nitride, silicon oxynitride, fluoride-doped silicate glass (FSG), or other low-k dielectric materials. The dielectric material 111 may be deposited by a chemical vapor deposition (CVD) process, a spin-on-glass process, or another applicable process.

Figure 1D:
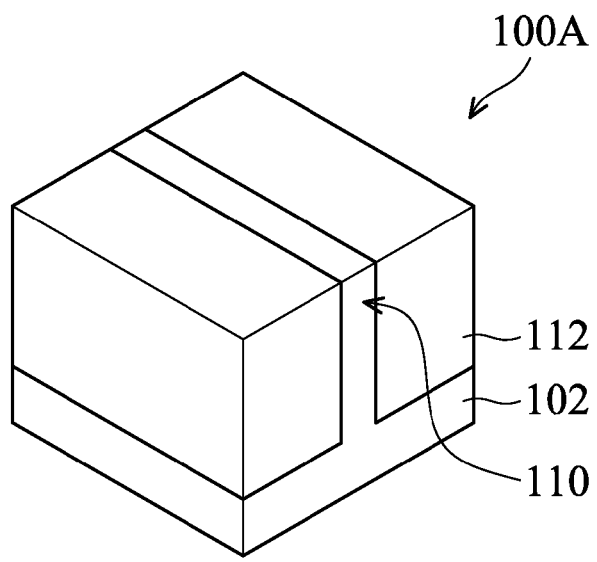

Afterwards, the dielectric material 111 is thinned or planarized to form an isolation structure 112 as shown in FIG. 1D, in accordance with some embodiments. In some embodiments, the dielectric material 111 is thinned by a chemical mechanical polishing (CMP) process. As a result, a top portion of the fin structure 110 is exposed, and the dielectric layer 104 and the hard mask layer 106 are removed. The top surface of the isolation structure 112 is level with the top surface of the fin structure 110.

Figure 1E:
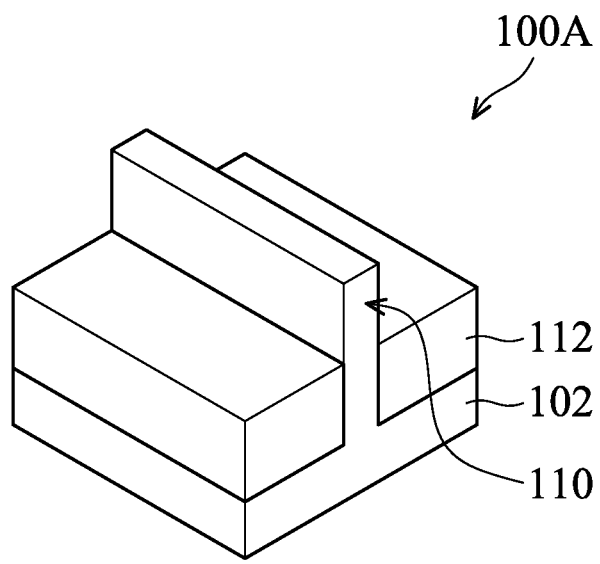

Afterwards, the top portion of the isolation structure 112 is removed as shown in FIG. 1E, in accordance with some embodiments. As a result, the fin structure 110 protrudes from the isolation structure 112. In other words, the top portion of the fin structure 110 is higher than the isolation structure 112. The top portion of the isolation structure 112 is removed by a wet etching process or a dry etching process. The remaining isolation structure 112 is seen as a shallow trench isolation (STI) structure.

Figure 1F:
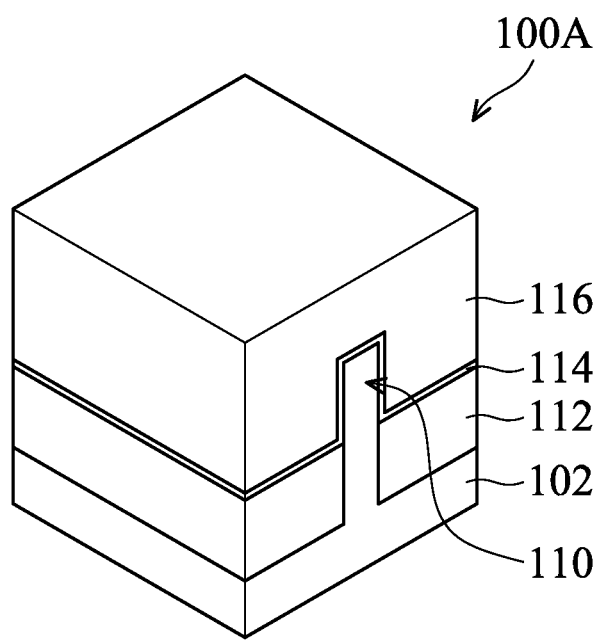

Afterwards, a dummy gate dielectric layer 114 and a dummy gate electrode layer 116 are formed on the fin structure 110 and the isolation structure 112 as shown in FIG. 1F, in accordance with some embodiments. In some embodiments, the dummy gate dielectric layer 114 is made of dielectric materials, such as silicon oxide, silicon nitride, silicon oxynitride, dielectric material(s) with high dielectric constant (high-k), or combinations thereof. The dummy gate dielectric layer 114 is formed by a deposition process, such as chemical vapor deposition (CVD), physical vapor deposition (PVD), atomic layer deposition (ALD), high density plasma CVD (HDPCVD), metal organic CVD (MOCVD), or plasma enhanced CVD (PECVD).

In some embodiments, the dummy gate electrode layer 116 is made of conductive or non-conductive materials. In some embodiments, the dummy gate electrode layer 116 is made of polysilicon. The dummy gate electrode layer 116 is formed by a deposition process, such as chemical vapor deposition (CVD), physical vapor deposition (PVD), atomic layer deposition (ALD), high density plasma CVD (HDP-CVD), metal organic CVD (MOCVD), or plasma enhanced CVD (PECVD).

Figure 1G:
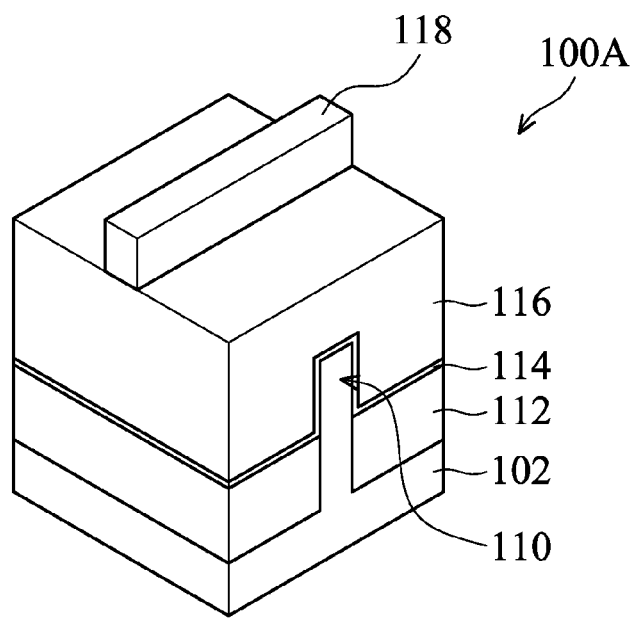

After the dummy gate electrode layer 116 is formed, a hard mask layer 118 is formed on the dummy gate electrode layer 116 as shown in FIG. 1G, in accordance with some embodiments. The hard mask layer 118 is patterned to form a patterned hard mask layer 118. The patterned hard mask layer 118 is used for protecting the underlying layers from being etched during the subsequent processes.

Figure 1H:
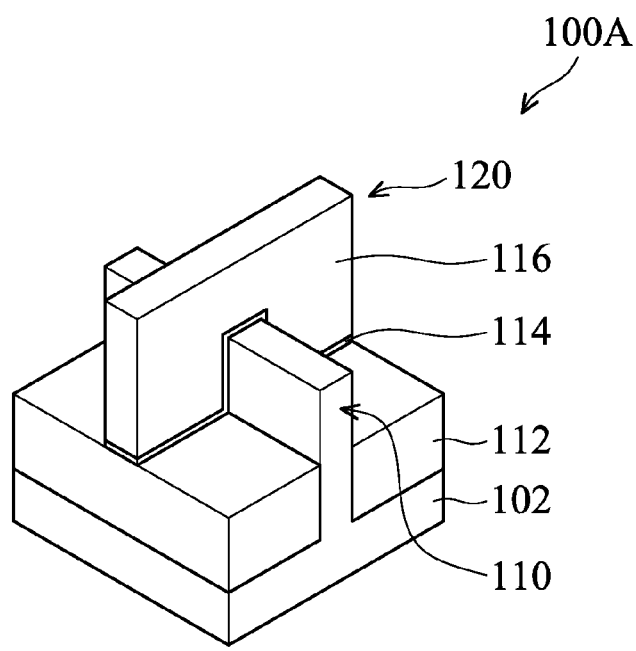

After the patterned hard mask layer 118 is formed, a portion of the dummy gate dielectric layer 114 and the dummy gate electrode layer 116 are removed to form a dummy gate structure 120 as shown in FIG. 1H, in accordance with some embodiments. The dummy gate structure 120 includes the portions of the dummy gate dielectric layer 114 and the dummy gate electrode layer 116 positioned below the patterned hard mask layer 118. The fin structure 110 is not covered by the dummy gate dielectric layer 114 except for the portion that is covered by the dummy gate structure 120. The portions of the dummy gate dielectric layer 114 and the dummy gate electrode layer 116 are removed by an etching process, such as a wet etching process or a dry etching process.

Figure 1I:
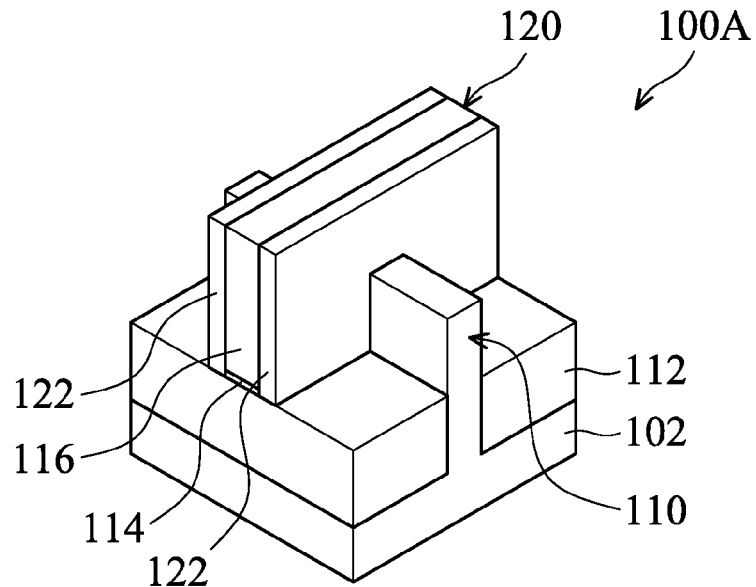

After the dummy gate structure 120 is formed, spacers 122 are formed on the opposite sidewalls of the dummy gate structure 120 as shown in FIG. 1I, in accordance with some embodiments. In some embodiments, spacers 122 are made of silicon nitride, silicon carbide, silicon oxynitride, silicon carbon, silicon oxide, silicon hydrogen, other applicable materials, or a combination thereof.

Figure 1J:
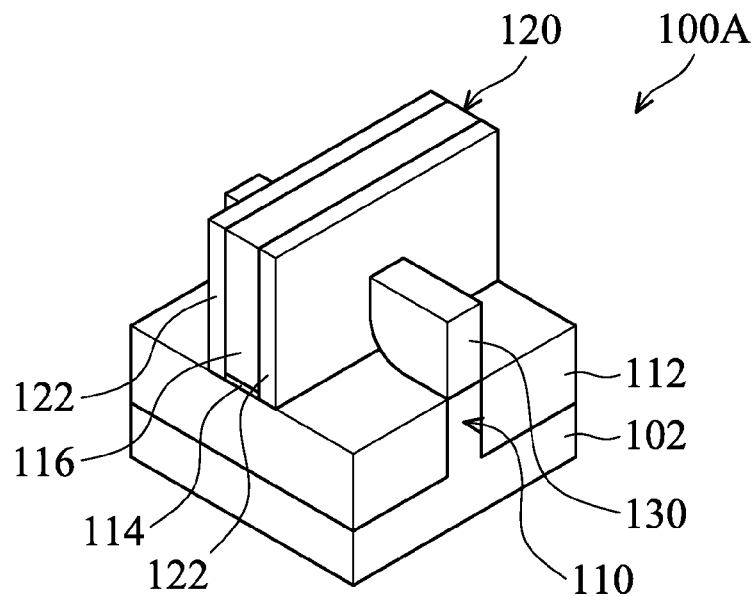

Afterwards, a top portion of the fin structure 110 is removed to form a recess (not shown), and source/drain (S/D) structures 130 are formed in the recess as shown in FIG. 1J, in accordance with some embodiments. In some embodiments, the source/drain structures 130 are strained source/drain structures. In some embodiments, the source/drain structures 130 are formed by growing a strained material in the recesses of the fin structure 110 by an epitaxial (epi) process. In addition, the lattice constant of the strained material may be different from the lattice constant of the substrate 102.

In some embodiments, the source/drain structures 130 include Ge, SiGe, InAs, InGaAs, InSb, GaAs, GaSb, InAlP, InP, or a combination thereof. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes.

In some embodiments, after the source/drain structures 130 are formed, a contact etch stop layer (CESL) (not shown) is formed on the source/drain structures 130 and the dummy gate structure 120. In some embodiments, the contact etch stop layer is made of silicon nitride, silicon oxynitride, and/or other applicable materials. The contact etch stop layer may be formed by plasma enhanced CVD, low pressure CVD, ALD, or other applicable processes.

Figure 1K:
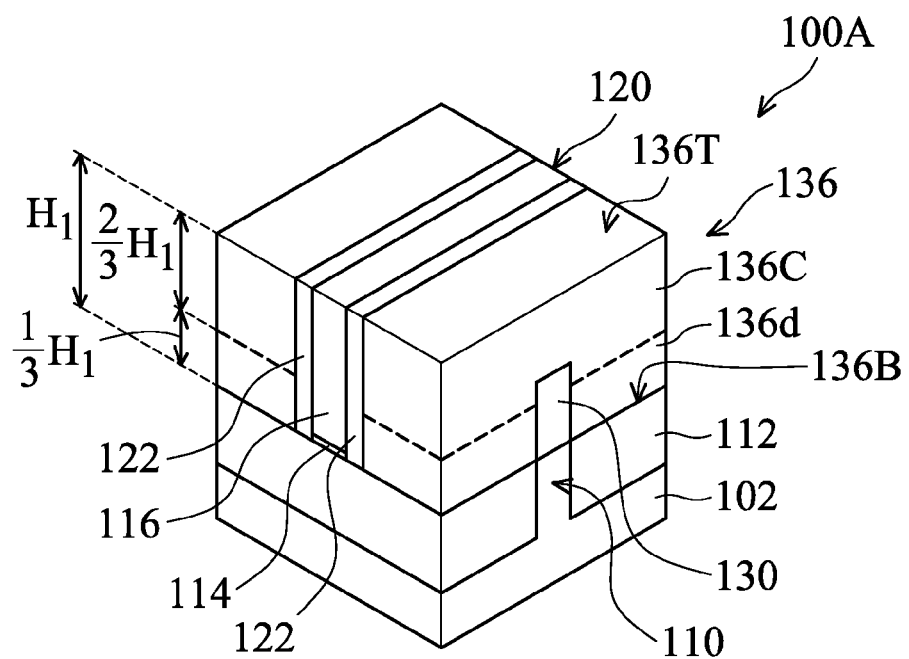

Afterwards, an inter-layer dielectric (ILD) structure 136 is formed over the contact etch stop layer 135 over the substrate 102 as shown in FIG. 1K, in accordance with some embodiments. In some embodiments, an inter-layer dielectric (ILD) material is formed over the isolation structure 112 and then is planarized to form the ILD structure 136.

As shown in FIG. 1K, the ILD structure 136 has a height $H_1$. In some embodiments, the height $H_1$ is in a range from about 90 nm to about 150 nm. The inter-layer dielectric (ILD) structure 136 has a top portion 136c and a bottom portion 136d. The height of the bottom portion 136d is one-third of that of the ILD structure 136. The bottom portion 136d is defined by a distance from the bottom surface 136B to a top surface of the bottom portion 136d (i.e. one third height of the height $H_1$). The height of the top portion 136c is two-thirds of that of the ILD structure 136. The top portion 136c is defined by a distance from the top surface 136T to a bottom surface of the top portion 136c. There is no real interface between the top portion 136c and the bottom portion 126d. The top portion 136c and the bottom portion 136d are used to define the profile of the Ge concentration. In some embodiments, the Ge concentration of the top portion 136c is in a range from about 0.1% to about 5%. In some embodiments, the Ge concentration of the bottom portion 136d is in a range from about 40% to about 50%.

It should be noted that the ILD structure 136 has a gradient germanium (Ge) concentration, and the Ge concentration is gradually increased from the top surface 136T of the ILD structure 136 to the bottom surface 136B of the ILD structure 136. In some embodiments, a Ge concentration difference between the top surface 136T of the inter-layer dielectric (ILD) structure 136 and the bottom surface 136B of the inter-layer dielectric (ILD) structure 136 is in a range from about 0.1% to about 50%. If the Ge concentration difference is too large, the original property of the ILD structure may be changed. If the Ge concentration difference is too low, the etching selectivity between the top portion 136c and the bottom portion 126d may be low and thus the bottom portion of the ILD structure 136 may not be removed.

As shown in FIG. 1K, a top surface of the S/D structure 130 is higher than a top surface of the bottom portion 136d of the ILD structure 136.

The ILD structure 136 is made of Ge-doped ILD material. The Ge-doped ILD material includes a dielectric material and Ge. The dielectric material may be made of silicon oxide, silicon nitride, silicon oxynitride, tetraethoxysilane (TEOS), phosphosilicate glass (PSG), borophosphosilicate glass (BPSG), low-k dielectric material, extreme low-k (ELK) dielectric material and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

The ELK dielectric material is made of ELK dielectric material which has a dielectric constant (k) less than about 2.5. The ELK dielectric material includes carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, the ELK dielectric material is made of a material including a porous version of an existing dielectric material, such as hydrogen silsesquioxane (HSQ), porous methyl silsesquioxane (MSQ), porous polyarylether (PAE), porous SiLK, or porous silicon oxide ($SiO_2$).

The Ge-doped ILD material may be formed by chemical vapor deposition (CVD), physical vapor deposition, (PVD), atomic layer deposition (ALD), spin-on coating, or other applicable processes.

In some embodiments, the Ge-doped ILD material is formed by mixing a silicon-containing precursor compound and a germanium-containing precursor compound into a chamber to perform a deposition process. The silicon-containing precursor compound includes tetraethoxysilane (TEOS), silane ($SiH_4$), disilane ($Si_2H_6$), trisilane ($Si_3H_8$), dichlorosilane (DCS) ($Si_2H_2Cl_2$), other suitable silicon-containing precursor gases, or combinations thereof. The germanium-containing precursor compound includes germane ($GeH_4$), digermane ($Ge_2H_6$), germanium tetrachloride ($GeCl_4$), germanium dichloride ($GeCl_2$), other suitable germanium-containing precursor gases, or combinations thereof.

The deposition process may be a chemical vapor deposition (CVD) process. In some embodiments, the CVD process is performed at a temperature in a range from about 300 degrees to about 500 degrees. In some embodiments, the CVD process is performed under a pressure in a range from about 50 mBar to about 500 mBar.

Figure 1L:
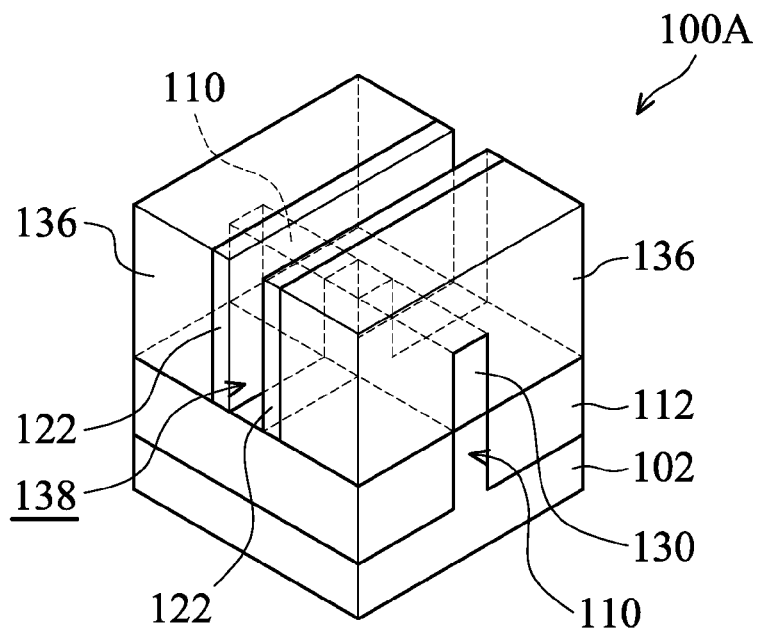

After the ILD structure 136 is formed, the dummy gate structure 120 is removed by form a trench 138 in the ILD structure 136 as shown in FIG. 1L, in accordance with some embodiments. The dummy gate structure 120 is removed by performing a first etching process and a second etching process. The dummy gate electrode layer 116 is removed by the first etching process, and the dummy gate dielectric layer 114 is removed by the second etching process. It should be noted that the fin structure 110 is not removed, and thus the middle portion of the fin structure 110 is exposed by the trench 138.

Figure 1M:
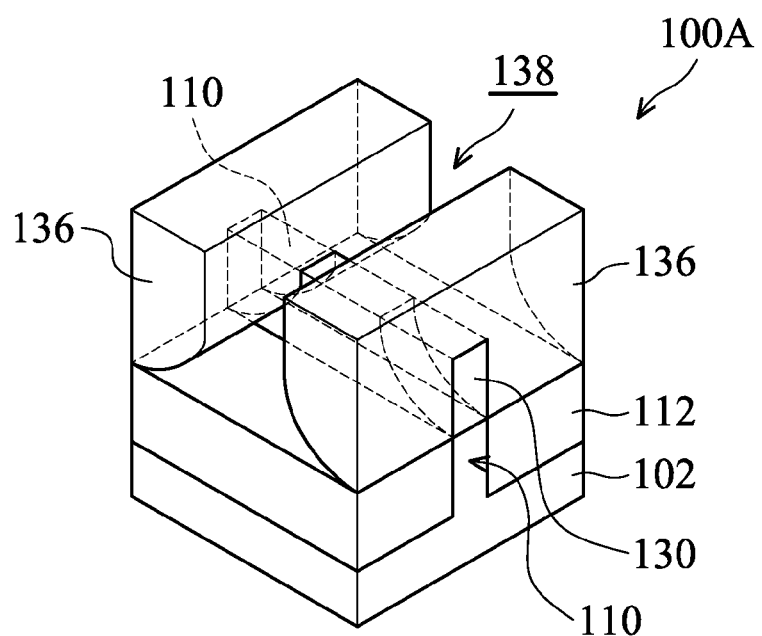

After the trench 138 is formed, the spacers 122, a portion of the ILD structure 136 is removed to enlarge the width of the trench 138 as shown in FIG. 1M, in accordance with some embodiments. More specifically, a portion of the bottom portion 136d of the ILD structure 136 is removed, and therefore the trench 138 has a wider bottom portion, and the bottom portion has a bottom width in a direction parallel to the fin structure 110. In some embodiments, the spacers 122 and the isolation structure 136 are respectively removed by an etching process. As described above, the middle portion of the fin structure 110 is not removed and thus exposed by the trench 138.

It should be noted that the as mentioned above, the ILD structure 136 has a gradient germanium (Ge) concentration, and the Ge concentration is gradually increased from the top surface 136T of the ILD structure 136 to the bottom surface 136B of the ILD structure 136. The etching rate of the ILD structure 136 with a higher Ge concentration is greater than that of the ILD structure 136 with a lower Ge concentration. Therefore, while performing the etching process, the bottom portion 136d of the ILD structure 136 is removed but the top portion 136c remains. The width of the bottom portion of the enlarged trench 138 gradually increases.

Figure 1N:
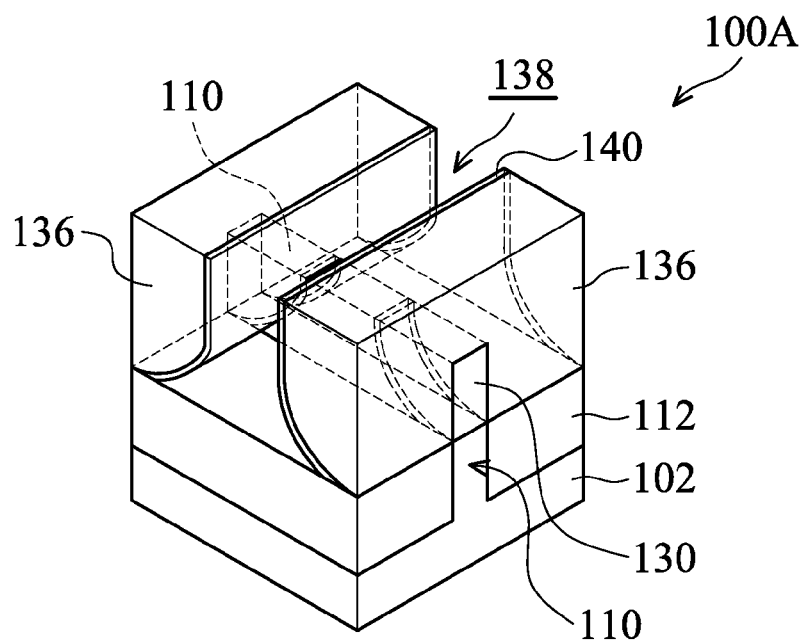
Figure 1O:
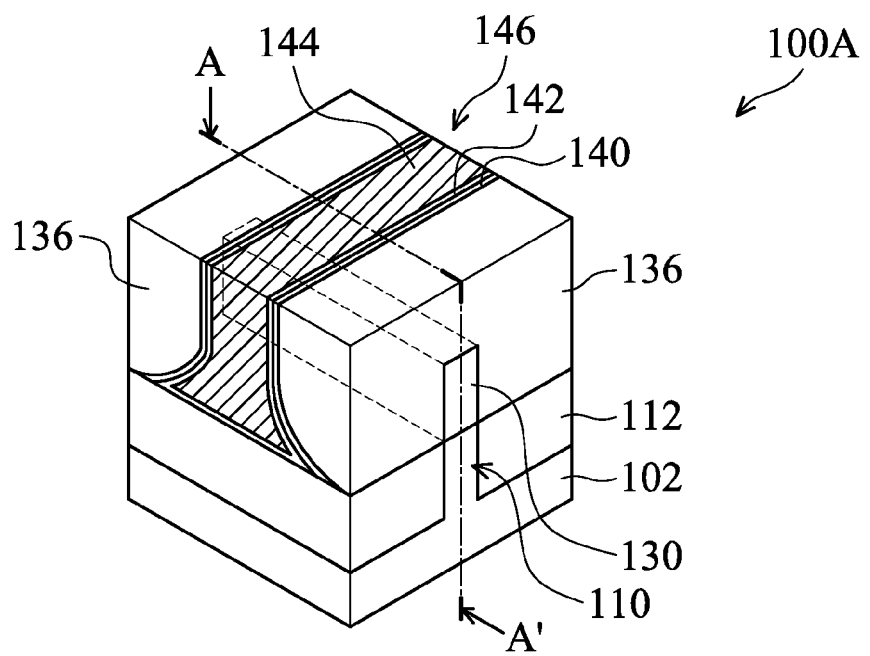
Figure 1O:
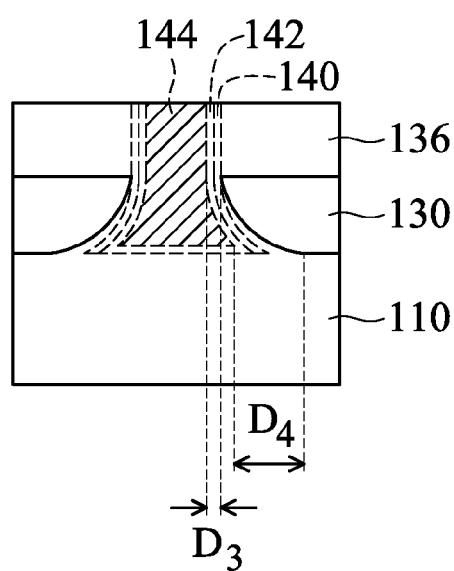

Afterwards, second spacers 140 are formed in the enlarged trench 138 as shown in FIG. 1N, in accordance with some embodiments. The second spacers 140 are formed on the opposite sidewall of the enlarged trench 138. The second spacers 140 line the sidewalls of the trench 138. The second spacers 140 have a top portion and a bottom portion. The bottom portion of the second spacers 140 is sloped to a top surface of the isolation structure 136.

Afterwards, a gate dielectric layer 142 and a gate electrode 144 are sequentially formed in the trench 138 as shown in FIG. 1O, in accordance with some embodiments. Therefore, a gate structure 146 including the gate dielectric layer 142 and the gate electrode layer 144 is obtained.

In some embodiments, the gate dielectric layer 142 is made of a high-k dielectric material. The high-k dielectric material may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or the like.

In some embodiments, the gate electrode layer 144 is made of a metal material. The metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or combinations thereof. The P-work-function metal includes titanium nitride (TiN), tungsten nitride (WN), tantalum nitride (TaN), ruthenium (Ru) or combinations thereof.

It should be noted that the gate structure 146 has a bottom portion with a bottom width in a direction parallel to the fin structure 110 and a top portion with a top width in a direction parallel to the fin structure 110, and the bottom width is wider than the width. The top portion of the gate structure 146 has vertical sidewalls, and the bottom portion of the gate structure 146 has sloped sidewalls. More specifically, the width of the bottom portion of the gate dielectric layer 142 gradually increases.

As shown in FIG. 1O, the bottom portion of the gate structure 146 has trumpet-like shape. In some other embodiments, the bottom portion of the gate structure 146 has diamond-like, breaker-like or vase-like shape.

FIG. 1O' shows a cross-sectional representation along line AA' of FIG. 1O, in accordance with some embodiments of the disclosure. The second spacers 140, the gate dielectric layer 142 and the gate electrode layer 144 are not observed along line AA', in order to show the relationship between the gate structure 146 and the S/D structures 130, the dashed lines shown in FIG. 1O' represent the projected figures of the second spacers 140, the gate dielectric layer 142 and the gate electrode layer 144.

It should be noted that since the trench 138 has a wide bottom portion, the second spacers 140 which firstly line the sidewalls of the trench 138 also have wide bottom portions. The bottom portions of the second spacers 140 have sloped sidewalls. In addition, the gate dielectric layer 142 and the gate electrode layer 144 are sequentially filled into the trench 138. The gate electrode layer 144 also has a sloped bottom portion and the width of the bottom portion of the gate electrode layer 144 gradually increases from the top down. In other words, the bottom portion of the gate electrode layer 144 is sloped to the top surface of the isolation structure 112.

Figure 4:
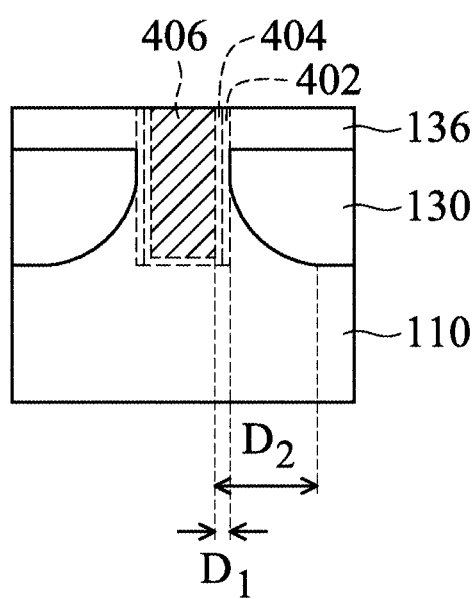
FIG. 4 shows a cross-sectional representation of a fin field effect transistor (FinFET) structure device of a comparative embodiment.

FIG. 4 shows a cross-sectional representation of a FinFET structure device of a comparative embodiment. A pair of second spacers 402 have vertical sidewalls, and a gate dielectric layer 404 and a gate electrode layer 406 have vertical sidewalls.

A proximity is defined by the distance between the projected figure of the gate electrode layer 144 and the S/D structures 130. It should be noted that the S/D structures 130 has a trapezoid-like shape which a bottom portion is narrower than the top portion of the S/D structure 130. As shown in FIG. 4, a top proximity is defined by the horizontal distance $D_1$ between a top surface of the S/D structure 130 and the projected gate electrode layer 406. A bottom proximity is defined by the horizontal distance $D_2$ between the bottom surface of the S/D structure 130 and the projected gate electrode layer 406. The distance $D_2$ is obviously longer than distance $D_1$. However, the performance of the FinFET device structure may be degraded by the large difference between the top proximity and the bottom proximity.

Compared with the second gate electrode 406 with the vertical bottom portion in comparative embodiment in FIG. 4, the gate electrode layer 144 of FIG. 1O' with sloped bottom portions are used to shorten the bottom proximity. The bottom proximity is defined by the horizontal distance $D_4$ between the bottom surface of the S/D structure 130 and the projected gate electrode layer 406. The top proximity is defined by the horizontal distance $D_3$ between the top surface of the S/D structure 130 and the projected gate electrode layer 406. The distance $D_4$ in FIG. 1O' is shorter than the distance $D_2$ in FIG. 4 due to the formation of the sloped bottom portion of the gate electrode layer 144.

Compared with the vertical gate electrode layer 406, the bottom portion of the gate electrode layer 144 has sloped sidewalls. Therefore, the difference between the distance $D_3$ and the distance $D_4$ is reduced by forming the sloped bottom portion of the gate electrode layer 144.

It should be noted that a first difference between the distance $D_3$ and the distance $D_4$ in FIG. 1O' is smaller than a second difference between the distance $D_1$ and the distance $D_2$ in FIG. 4. Therefore, the uniformity in the proximity is improved. In addition, the performance of the FinFET device structure is improved due to improved uniformity in the proximity.

FIGS. 2A-2F show perspective representations of forming a fin field effect transistor (FinFET) device structure 100B, in accordance with some embodiments of the disclosure.

Figure 2A:
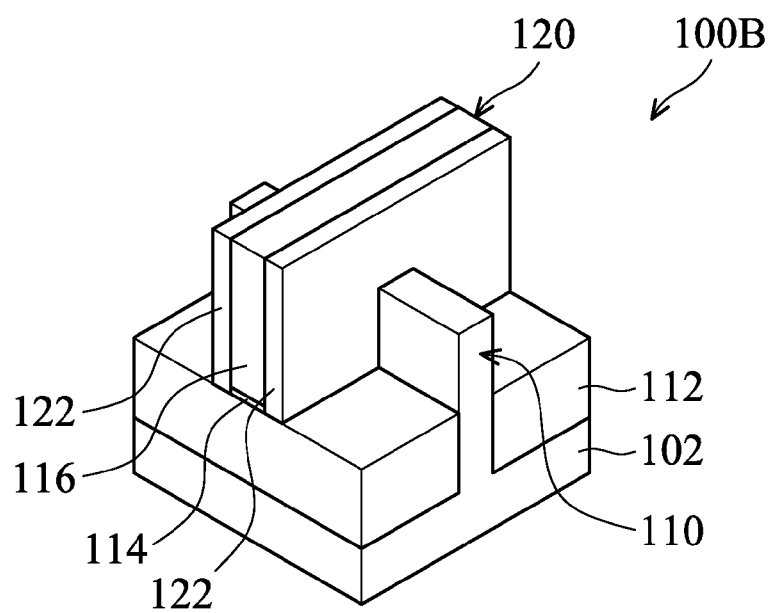
FIGS. 2A-2F show perspective representations of forming a fin field effect transistor (FinFET) device structure, in accordance with some embodiments of the disclosure.

Referring to FIG. 2A, the dummy gate structure 120 is transversely overlying a middle portion of the fin structure 110. The dummy gate structure 120 includes the dummy gate dielectric layer 114 and the dummy gate electrode layer 116. The spacers 122 are formed on the opposite sidewalls of the dummy gate electrode layer 116.

Figure 2B:
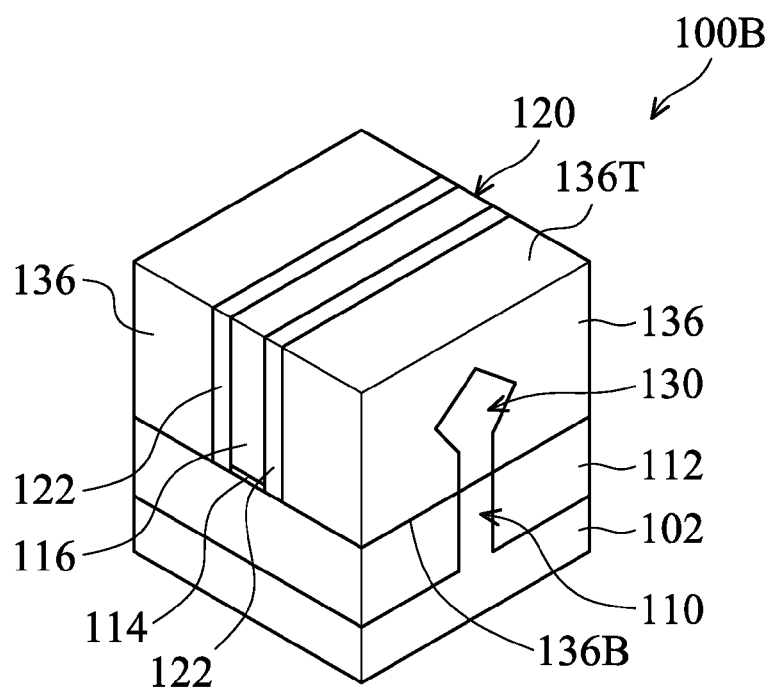

Afterwards, a portion of the fin structure 110 is removed and the source/drain (S/D) structures 130 is formed on the fin structure 110 as shown in FIG. 2B, in accordance with some embodiments of the disclosure. Unlike FIG. 1J, the S/D structure 130 has a polygonal shape in FIG. 2B.

Afterwards, the ILD structure 136 is formed over the isolation structure 112 over the substrate 102. In some embodiments, an inter-layer dielectric (ILD) material is formed over the isolation structure 112 and then is planarized to form the ILD structure 136.

It should be noted that the ILD structure 136 has a gradient germanium (Ge) concentration, and the Ge concentration gradually increases from a top surface 136T of the ILD structure 136 to a bottom surface 136B of the ILD structure 136. Since the Ge-doped ILD structure 136 has Ge concentration gradient, a bottom portion of the ILD structure 136 is removed by the etching process performed later, but the top portion of the ILD structure 136 remains.

Figure 2C:
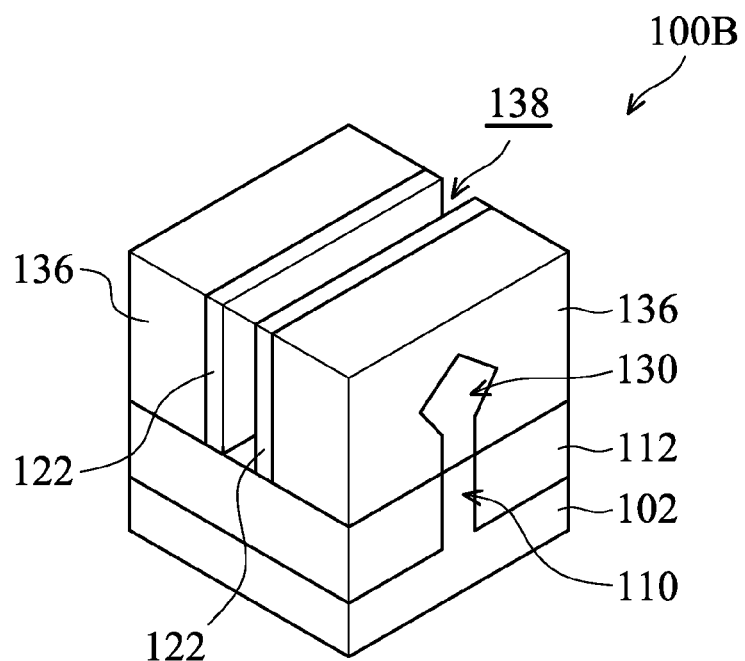

After the ILD structure 136 is formed, the dummy gate electrode layer 116 is removed to form the trench 138 as shown in FIG. 2C, in accordance with some embodiments of the disclosure.

Figure 2D:
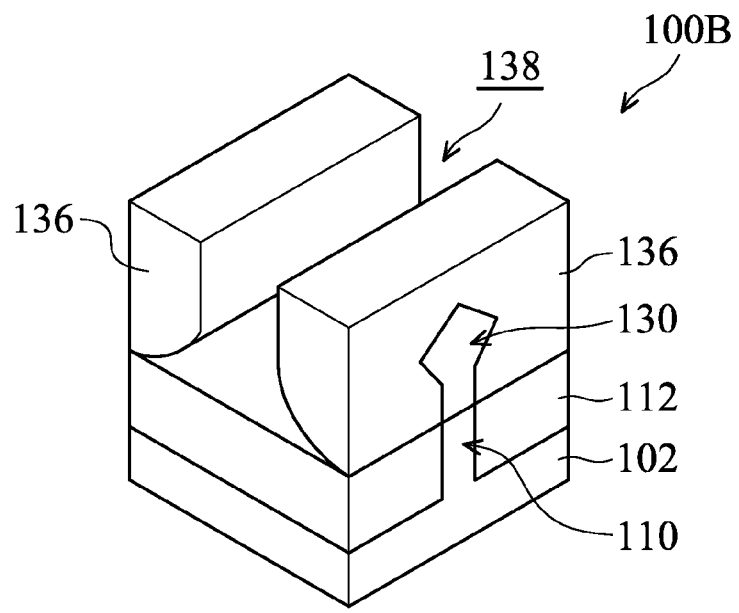

Afterwards, the spacers 122 and a portion of the ILD structure 136 are removed to enlarge the width of the trench 138 as shown in FIG. 2D, in accordance with some embodiments. More specifically, the bottom portion of the ILD structure 136 is removed, and therefore the trench 138 has a wider bottom portion. The bottom portion of the trench 138 has sloped sidewalls.

Figure 2E:
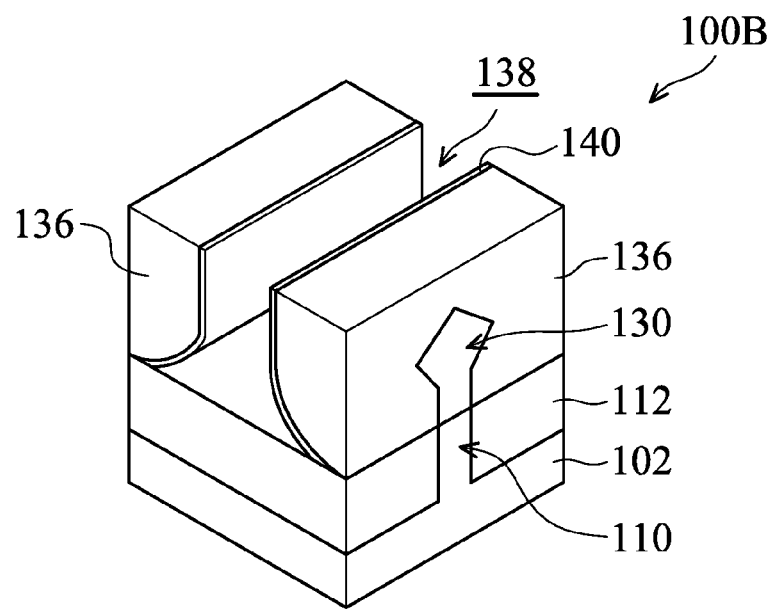

Afterwards, second spacers 140 are formed in the enlarged trench 138 as shown in FIG. 2E, in accordance with some embodiments. The second spacers 140 are formed on the opposite sidewall of the enlarged trench 138.

Figure 2F:
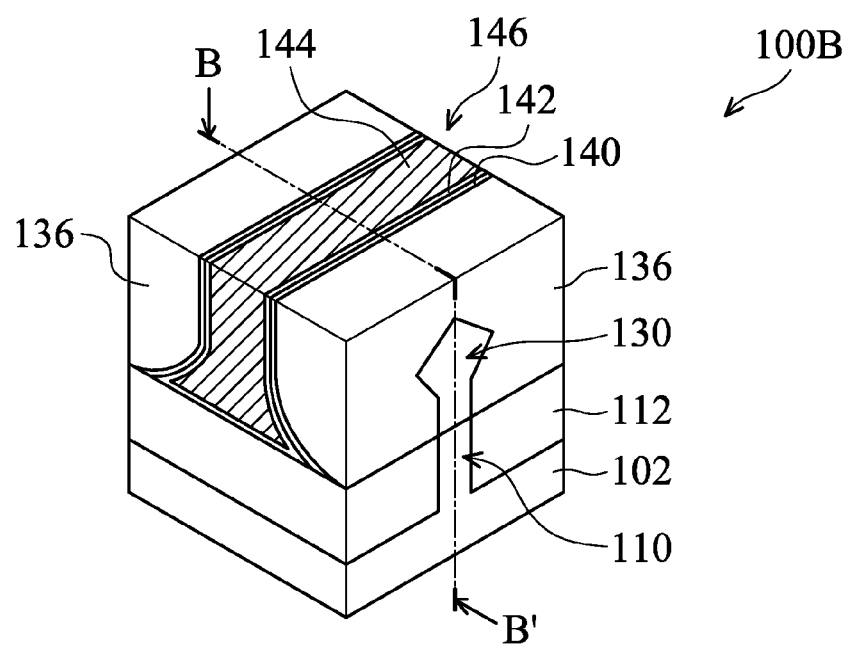
Figure 2F:
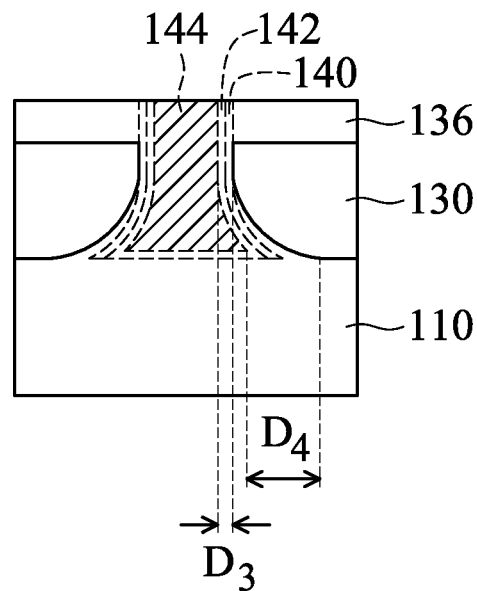

Afterwards, the gate dielectric layer 142 and the gate electrode 144 are sequentially formed in the trench 138 as shown in FIG. 2F, in accordance with some embodiments. Therefore, the gate structure 146 including the gate dielectric layer 142 and the gate electrode layer 144 is obtained.

FIG. 2F' shows a cross-sectional representation along line BB' of FIG. 2F, in accordance with some embodiments of the disclosure.

The second spacers 140, the gate dielectric layer 142 and the gate electrode layer 144 are not observed along line BB', in order to show the relationship between the gate structure 146 and the S/D structures 130, the dashed lines shown in FIG. 2F' represent the projected figures of the gate structure 146 and the second spacers 140.

It should be noted that since the trench 138 has a wide bottom portion, the second spacers 140 which firstly line the sidewalls of the trench 138 also have wide bottom portions. The bottom portions of the second spacers 140 have sloped sidewalls. In addition, the gate dielectric layer 142 and the gate electrode layer 144 are sequentially filled into the trench 138. The gate electrode layer 144 also has a sloped bottom portion and the width of the bottom portion gradually increases from top to down in a direction parallel to the fin structure 110. In other words, the bottom portion of the gate electrode layer 144 is sloped to a top surface of the isolation structure 112.

Compared with the second spacers with the vertical bottom portion in another embodiment, the gate electrode layer 144 with sloped bottom portions are used to shorten the bottom proximity. Therefore, the performance of the semiconductor is improved when the bottom proximity is reduced.

Figure 3A:
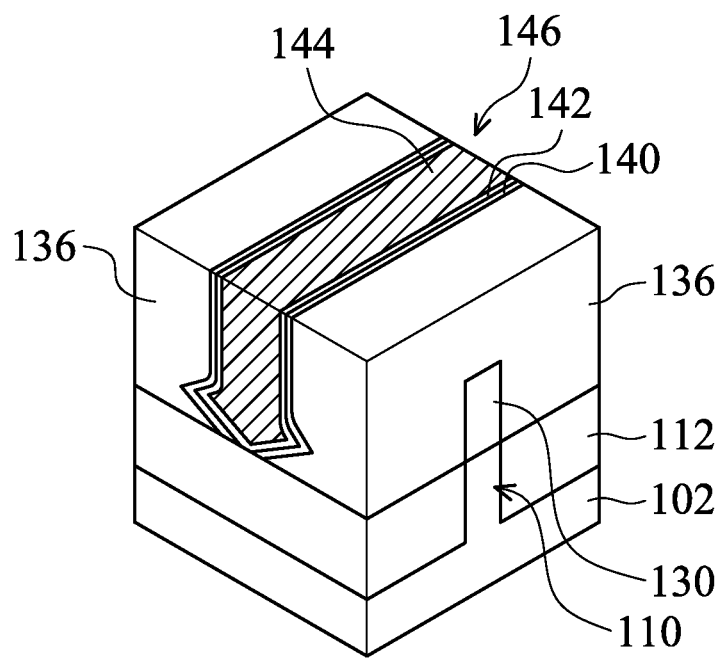
FIGS. 3A-3C show perspective representations of fin field effect transistor (FinFET) device structures, in accordance with some embodiments of the disclosure.
Figure 3B:
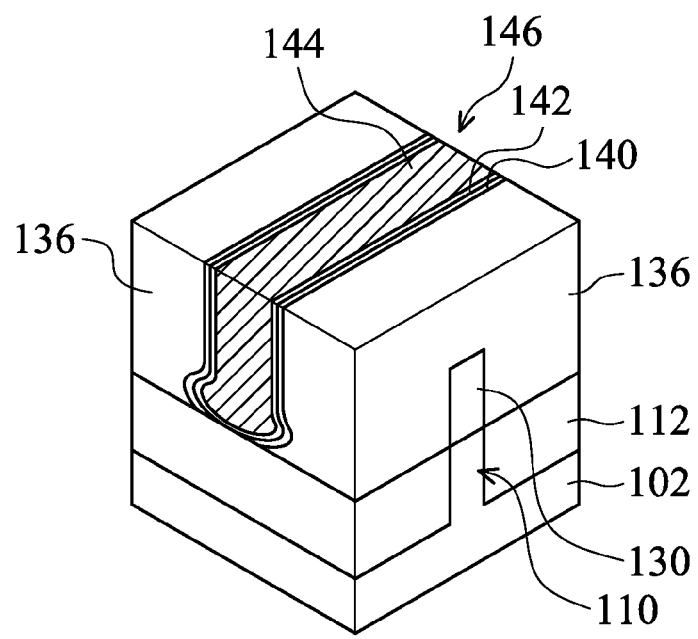
Figure 3C:
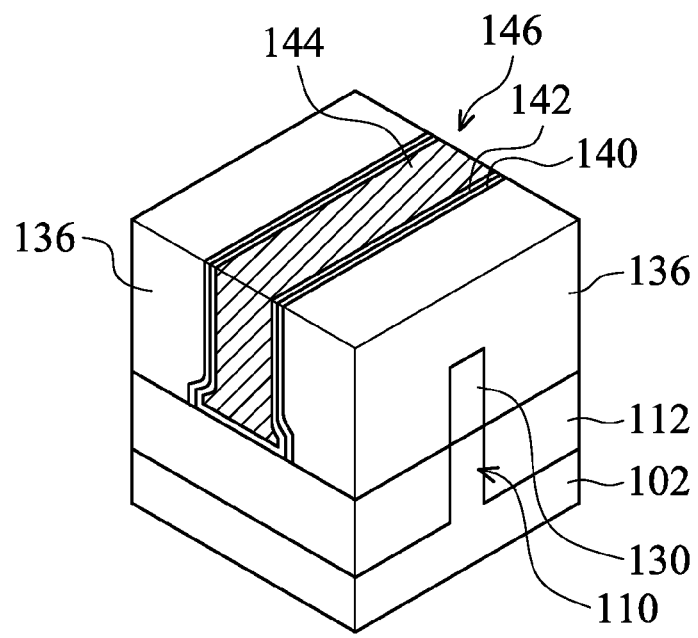

FIG. 3A-3C shows perspective representations of fin field effect transistor (FinFET) device structures, in accordance with some embodiments of the disclosure.

As shown in FIG. 3A, the gate structure 146 includes the gate dielectric layer 142 and the gate electrode layer 146. The bottom portion of the gate structure 146 has a diamond-like shape. As shown in FIG. 3B, the bottom portion of the gate structure 146 has a breaker-like shape. As shown in FIG. 3C, the bottom portion of the gate structure 146 has a vase-like shape. It should be noted that the gate structures 146 in FIG. 3A-3C have wide bottom portions, and the bottom portions have sloped sidewalls. Therefore, the bottom proximity is decreased and the performance of the fin field effect transistor (FinFET) device structures is improved.

Embodiments for forming fin field effect transistor (FinFET) device structure are provided. A fin structure is formed over a substrate, and a gate structure formed on a middle portion of the fin structure. A S/D structure is formed adjacent to the gate structure, and an ILD structure formed on the S/D structure. The ILD structure has a gradient Ge concentration, and the concentration is increased from a top surface to a bottom surface. The gate structure has a sloped bottom portion, and the width of the sloped bottom portion gradually increases from top to down. Since the sloped bottom portion of the gate structure, the bottom proximity between the S/D structure and the projected gate structure is improved. Therefore, the uniformity in the proximity is improved. In addition, the performance of the FinFET device structure is improved.

In some embodiments, a FinFET device structure is provided. The FinFET device structure includes a substrate and a fin structure extending above the substrate. The FinFET device structure includes an isolation structure, and the fin structure is embedded in the isolation structure. The FinFET device structure also includes a gate structure formed on a middle portion of the fin structure. The gate structure has a top portion and bottom portion, and the bottom portion is wider than the top portion. The FinFET device structure further includes a source/drain (S/D) structure formed adjacent to the gate structure.

In some embodiments, a fin field effect transistor (FinFET) device structure is provided. The FinFET device structure includes a substrate and a fin structure extending above the substrate. The FinFET device structure also includes a gate structure transversely overlying the fin structure. The gate structure has structure a top portion and bottom portion, the top portion of the gate structure has vertical sidewalls, and the bottom portion has sloped sidewalls. The FinFET device structure includes a source/drain (S/D) structure formed adjacent to the gate structure. The FinFET device structure further includes an inter-layer dielectric (ILD) structure formed adjacent to the gate structure, and the ILD structure has a gradient germanium (Ge) concentration.

In some embodiments, a method for forming a fin field effect transistor (FinFET) device structure is provided. The method for forming a fin field effect transistor (FinFET) device structure includes providing a substrate and forming a fin structure on the substrate. The method for forming a fin field effect transistor (FinFET) device structure also includes forming an isolation structure on the substrate, and the fin structure is embedded in the isolation structure. The method for forming a fin field effect transistor (FinFET) device structure further includes forming a dummy gate structure on a middle portion of the fin structure and forming a source/drain (S/D) structure adjacent to the dummy gate structure. The method for forming a fin field effect transistor (FinFET) device structure includes forming an inter-layer dielectric (ILD) structure formed adjacent to the dummy gate structure, and the ILD structure has a gradient germanium (Ge) concentration. The method for forming a fin field effect transistor (FinFET) device structure also includes removing the dummy gate structure to form a trench and removing a portion of the ILD structure to enlarge the width of the bottom portion of the trench. The method for forming a fin field effect transistor (FinFET) device structure includes filling a gate structure into the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising:
a substrate;
a fin structure extending above the substrate;
an isolation structure, wherein the fin structure is embedded in the isolation structure;
a gate structure formed on a middle portion of the fin structure, wherein the gate structure has a top portion with a top width in a direction parallel to the fin and bottom portion with a bottom width in a direction parallel to the fin, and the bottom width is wider than the top width;
a source/drain (S/D) structure formed adjacent to the gate structure; and an inter-layer dielectric (ILD) structure formed adjacent to the gate structure, wherein the ILD structure has a gradient germanium (Ge) concentration.

2. The fin field effect transistor (FinFET) device structure as claimed in claim 1, wherein the bottom portion of the gate structure has a trumpet-like, diamond-like, breaker-like, or vase-like shape.

3. The fin field effect transistor (FinFET) device structure as claimed in claim 1, wherein the gradient germanium (Ge) concentration is increased from a top surface to a bottom surface of the inter-layer dielectric (ILD) structure.

4. The fin field effect transistor (FinFET) device structure as claimed in claim 3, wherein a germanium (Ge) concentration difference between the top surface and the bottom surface of the inter-layer dielectric (ILD) structure is in a range from about 0.1% to about 50%.

5. The fin field effect transistor (FinFET) device structure as claimed in claim 1, wherein bottom portion of the gate structure is sloped to a top surface of the isolation structure.

6. The fin field effect transistor (FinFET) device structure as claimed in claim 1, further comprising:
a spacer formed adjacent to the gate structure, wherein the spacer has a top portion and a bottom portion, and the bottom portion of the spacer is sloped to a top surface of the isolation structure.

7. The fin field effect transistor (FinFET) device structure as claimed in claim 1, wherein the top portion of the gate structure has vertical sidewalls, and the bottom portion has sloped sidewalls.

8. The fin field effect transistor (FinFET) device structure as claimed in claim 1, wherein a width of the bottom portion is increased from top to down.

9. A fin field effect transistor (FinFET) device structure, comprising:
a substrate;
a fin structure extending above the substrate;
a gate structure transversely overlying the fin structure, wherein the gate structure has structure a top portion and bottom portion, the top portion of the gate structure has vertical sidewalls, and the bottom portion has sloped sidewalls;
a source/drain (S/D) structure formed adjacent to the gate structure; and
an inter-layer dielectric (ILD) structure formed adjacent to the gate structure, wherein the inter-layer dielectric (ILD) structure has a gradient germanium (Ge) concentration.

10. The fin field effect transistor (FinFET) device structure as claimed in claim 9, wherein the bottom portion of the gate structure has a trumpet-like, diamond-like, breaker-like, or vase-like shape.

11. The fin field effect transistor (FinFET) device structure as claimed in claim 9, wherein a width of the bottom portion of the gate structure is increased.

12. The fin field effect transistor (FinFET) device structure as claimed in claim 9, further comprising:
an isolation structure, wherein the fin structure is embedded in the isolation structure, and the bottom portion of the gate structure is sloped to a top surface of the isolation structure.

13. The fin field effect transistor (FinFET) device structure as claimed in claim 12, wherein the fin structure of the gate structure has a fin height which protrudes from the isolation structure, and the bottom portion has a height which is one-third of the fin height.

14. The fin field effect transistor (FinFET) device structure as claimed in claim 12, further comprising:
a spacer formed adjacent to the gate structure, wherein the spacer has a top portion and a bottom portion, and the bottom portion of the spacer is sloped to a top surface of the isolation structure.

15. The fin field effect transistor (FinFET) device structure as claimed in claim 9, wherein the gradient germanium (Ge) concentration is increased from a top surface to a bottom surface of the inter-layer dielectric (ILD) structure.

16. A method for forming a fin field effect transistor (FinFET) device structure, comprising:
receiving a substrate;
forming a fin structure on the substrate;
forming an isolation structure on the substrate, wherein the fin structure is embedded in the isolation structure;
forming a dummy gate structure on a middle portion of the fin structure;
forming a source/drain (S/D) structure adjacent to the dummy gate structure;
forming an inter-layer dielectric (ILD) structure formed adjacent to the dummy gate structure, wherein the ILD structure has a gradient germanium (Ge) concentration;
removing the dummy gate structure to form a trench;
removing a portion of the ILD structure to enlarge a width of a bottom portion of the trench; and
filling a gate structure into the trench.

17. The method for forming the fin field effect transistor (FinFET) device structure as claimed in claim 16, wherein forming the ILD structure comprises:
mixing a germanium-containing compound and a silicon-containing compound;
performing a deposition process on the dummy gate structure and the fin structure.

18. The method for forming the fin field effect transistor (FinFET) device structure as claimed in claim 16, wherein the trench has a top portion and a bottom portion, and the bottom portion of the trench is wider than the top portion of the trench after removing the portion of the ILD structure.

19. The method for forming the fin field effect transistor (FinFET) device structure as claimed in claim 16, further comprising:
forming a spacer lining the sidewalls of the trench, before filling the gate structure into the trench.

* * * * *